(12) United States Patent
Vashchenko et al.

(10) Patent No.: US 7,935,605 B1
(45) Date of Patent: May 3, 2011

(54) LATERAL RESURF NPN WITH HIGH HOLDING VOLTAGE FOR ESD APPLICATIONS

(75) Inventors: Vladislav Vashchenko, Palo Alto, CA (US); Peter J. Hopper, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 539 days.

(21) Appl. No.: 11/906,358

(22) Filed: Oct. 2, 2007

(51) Int. Cl.
*H01L 21/8222* (2006.01)

(52) U.S. Cl. ........................ 438/328; 438/236

(58) Field of Classification Search ............ 438/236, 438/328
See application file for complete search history.

(56) References Cited

U.S. PATENT DOCUMENTS 7,180,158 B2 * 2/2007 Khemka et al. ............. 257/565

* cited by examiner

*Primary Examiner* — Douglas M Menz
(74) *Attorney, Agent, or Firm* — Jurgen K. Vollrath; Vollrath & Associates

(57) ABSTRACT

In an ESD protection circuit an NPN BJT snapback device is provided with high breakdown voltage by including a RESURF region or by forming a PIN diode in the BJT. Holding voltage is increased by forming a sub-collector sinker region with the desired configuration.

3 Claims, 2 Drawing Sheets

LATERAL RESURF NPN WITH HIGH HOLDING VOLTAGE FOR ESD APPLICATIONS

FIELD OF THE INVENTION

The invention relates to Electrostatic Discharge (ESD) protection device. In particular it relates to an ESD protection device for high voltage, high frequency applications.

BACKGROUND OF THE INVENTION

Integrated circuits that include MOS transistors are particularly susceptible to damage by electrostatic discharge (ESD) events, e.g. when the circuit is touched by a person handling the circuit causing static electricity to discharge from the handler through the circuit. This is particularly the case once the circuit has been packaged but prior to it being installed in a product.

In the case of high frequency, high voltage devices such as switching voltage regulators, the design of ESD protection circuits is particularly challenging due to the overlap of the ESD regime with the normal operation regime thereby resulting in a negative ESD protection window in the voltage and time domains. In other words neither the high voltage of an ESD event nor the short dV/dt characteristics can be used to distinguish over the switching characteristics experienced by switching voltage regulators during normal operation.

Thus the prior art approach of triggering a DSCR by means of a Zener diode connected to the gate of the DSCR does not work. Although the Zener breaks down to provide the desired gate voltage to the DSCR during ESD events it will be appreciated that in high voltage applications where the normal operating voltage waveform exceeds the Zener breakdown voltage the DSCR would be triggered even during normal operation.

The present invention seeks to provide an ESD protection solution for these situations that avoids the above problems by providing an ESD protection structure with a higher breakdown voltage than the normal operating voltage of the circuit it is protecting.

SUMMARY OF THE INVENTION

According to the invention there is provided an ESD protection BJT that includes means for increasing the breakdown voltage and keeps the gain of all parasitic BJTs low so as to avoid avalanche breakdown due to induced displacement currents. Preferably the BJT also includes means for increasing the holding voltage. The breakdown voltage may be increased by introducing a blocking junction in the form of either a RESURF region or a PIN diode. The BJT typically includes a shallow n-well and the blocking junction may comprise a deep p-well (PRESURF, i.e. p-reduced surface electric filed) that overlaps the n-well. The amount of overlap may be adjusted to change the breakdown voltage of the BJT. The n-well and p-well of the BJT may be formed in an n-epitaxial layer (n-epi) and a lateral BJT may be defined by forming an n-sinker in the n-epi. The breakdown voltage in this case may also be increased by providing a PIN diode structure in the BJT, as defined by the p-well and the n-sinker. The means for increasing the holding voltage may comprise a sub-collector of the BJT as defined by the n-sinker.

DETAILED DESCRIPTION OF THE INVENTION

The present invention provides an ESD protection circuit for high voltage, high speed applications such as integrated switching voltage regulators. The ESD protection circuit is based on a BJT structure that operates vertically and laterally.

Figure 1:
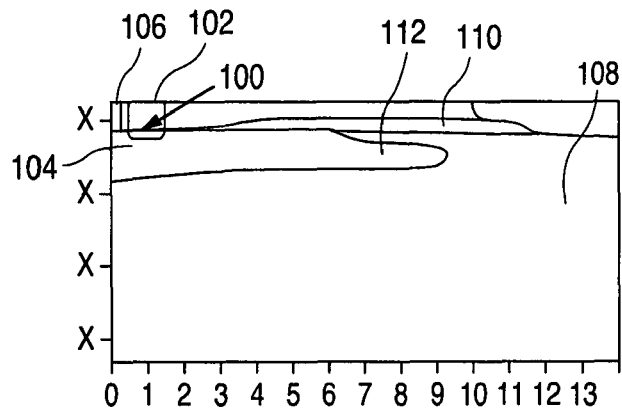
FIG. 1 shows a cross section through one embodiment of a BJT of the invention, showing a PRESURF with one amount of overlap.
Figure 2:
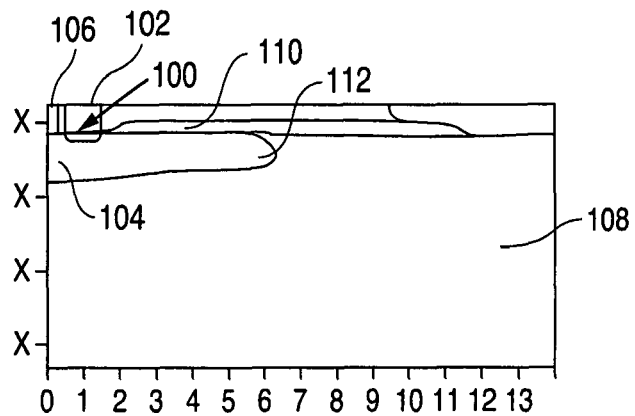
FIG. 2 shows a cross section through another embodiment of a BJT of the invention, showing a PRESURF with a second amount of overlap.
Figure 3:
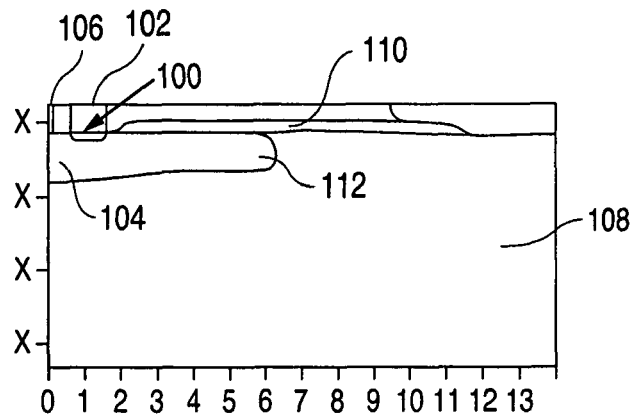
FIG. 3 shows a cross section through another embodiment of a BJT of the invention, showing a PRESURF with a third amount of overlap.

In particular, the present ESD protection circuit provides for high breakdown voltage, low dV/dt and preferably also high holding voltage to avoid latch-up after triggering. One set of embodiments of the invention is shown in FIGS. 1-3, which each show a BJT comprising an n-type emitter 100 with emitter contact 102, and p-type base 104 with base contact 106 formed in n-epitaxial region 108. The p-type base 104 extends laterally as a p-well or p-reduced surface electric field (PRESURF) (indicated by reference numeral 112) under a shallow n-drift or n-well region 110. By providing a laterally extending p-well or PRESURF the structure forms a sandwich that stretches the electric field thereby providing a higher breakdown voltage. The embodiments shown in FIGS. 1-3 distinguish themselves in the extent to which the PRESURF extends laterally, in other words the length of the overlap between the PRESURF and the n-well.

Figure 4:
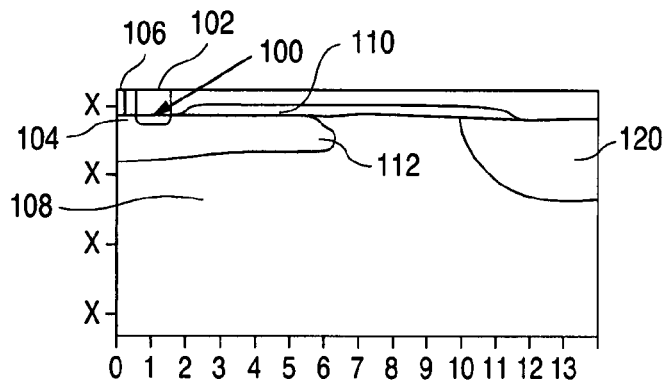
FIG. 4 shows a cross section through yet another embodiment of a BJT of the invention, showing a PRESURF and an n-sinker with a negative overlap of the PRESURF and n-sinker.
Figure 5:
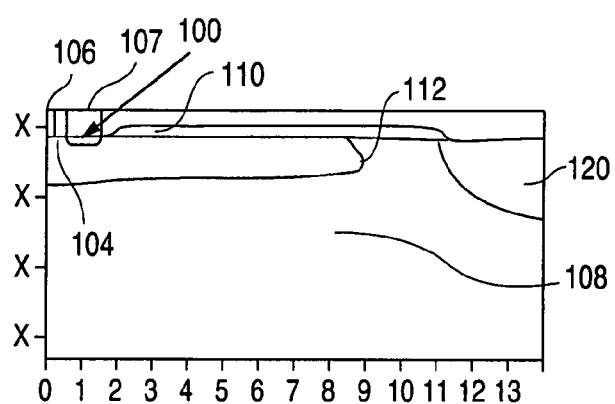
FIGS. 5 and 6 show a cross sections through two other embodiments of a BJT of the invention, showing a PRESURF and an n-sinker with a positive overlap of the PRESURF and n-sinker.
Figure 6:
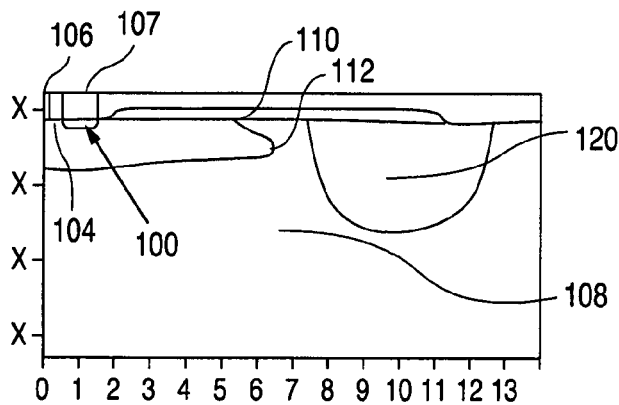

In a second set of embodiments, shown in FIGS. 4-6, a sub-collector region in the form of an n-sinker 120 is included. Since the other elements remain similar to the embodiments of FIGS. 1-3, the same reference numerals have been retained for the emitter 100, emitter contact, 102, base 104, base contact 106, n-epi 108, n-well 110, and PRESURF 112. The embodiments of FIGS. 4-6 distinguish themselves by having different overlaps between the p-well (PRESURF) 112 and the n-sinker 120. In the embodiment of FIG. 4 there is a space (also referred to as a negative overlap or an underlap) between the PRESURF 112 and the n-sinker 120), while in the embodiments of FIGS. 5 and 6 there is a positive overlap. The n-sinker 120 in the FIG. 5 embodiment is defined by a spot-like n-implant, while the n-sinker in the FIG. 6 embodiment to comprises a sinker extending to an n-buried layer (NBL). Studies have shown that a negative overlap reduces the S-shape of the drain current vs. drain-source voltage curve compared to an embodiment without a sinker. A positive overlap further reduces the S-shape of the drain current vs. drain-source voltage curve, especially if the sinker extends vertically to define a sub-collector region.

However the inclusion of an n-sinker has also been shown to cause a decrease in the breakdown voltage for certain n-sinker tail configurations. The n-sinker, which is usually heavily doped, and the n-buried layer to which the n-sinker connects are formed at an early stage of the process. Tests have shown that the positioning of the sinker implant impact the breakdown voltage of the BJT. In particular, if the n-sinker is not properly spaced apart from the base the tail of the n-sinker implant can cause a lower breakdown voltage. In other words the lateral diffusion that takes place when the sinker is implanted may impact the breakdown voltage if it touches the p-base or the space charge region of the n-collector.

Insofar as the sinker does reduce the breakdown voltage to a greater extent than desired, one embodiment makes use of a PRESURF to increase the breakdown voltage or uses the n-sinker together with the PRESURF to form a PIN diode that helps address the decrease in breakdown voltage.

The embodiments of FIGS. 5 and 6 with their positive overlap define a PIN diode as defined by the pn junction provided by the PRESURF and the n-sinker.

Figure 7:
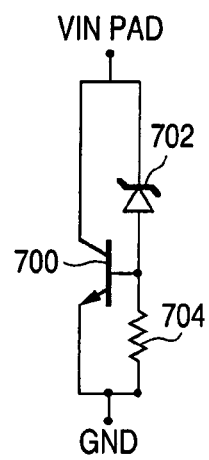
FIG. 7 is a schematic circuit diagram implementing a BJT of the invention in an ESD protection circuit.

FIG. 7, shows a BJT 700 of the invention implemented in an ESD protection circuit. A Zener diode 702 is connected between the pad and the base of the BJT 700 to allow the high breakdown voltage of the BJT to be controlled by biasing the base of the BJT 700 to a defined voltage as defined by the Zener breakdown voltage. A resistor 704 connects the base of the BJT to ground to avoid an indeterminate voltage on the base prior to the Zener diode 702 conducting.

As discussed above, insofar as the BJT is to be used in high speed applications, care should be taken to avoid dV/dt triggering by ensuring low gain (beta) for parasitic BJTs. This is achieved by proper layout spacing as known in the art. Tests also indicate that the thicker the base of the NPN BJT the lower the beta. The sub-collector implant has also been found to impact the beta. Thus the present invention also proposes adjusting the sub-collector spacing to control the beta.

While the above invention has been described with respect to a few specific embodiments it will be appreciated that the invention is not limited to these embodiments but can be implemented in other ways without departing froin m the scope of the invention as defined by the claims.

What is claimed is:

1. A method of increasing the holding voltage of an NPN BJT, wherein the BJT includes a collector with a collector contact, an emitter with an emitter contact, a base with a base contact, and a shallow n-well extending laterally from the collector contact, the method comprising adding a sub-collector in the form of an n-sinker to the BJT, and adding a deep p-well extending laterally from the base contact to define a PIN diode between the n-sinker and the and the deep p-well.

2. A method of claim 1, further comprising adding a reduced surface electric field region (RESURF region) to the BJT to at least partially compensate for any decrease in breakdown voltage caused by the sub-collector, wherein the method of adding a RESURF region comprises partially overlapping the deep p-well with the shallow n-well.

3. A method of claim 2, wherein the amount of overlap is adjusted to change the breakdown voltage of the BJT.

* * * * *